United States Patent
Long

(10) Patent No.: US 12,400,831 B2
(45) Date of Patent: *Aug. 26, 2025

(54) DUAL FREQUENCY MATCHING CIRCUIT FOR INDUCTIVELY COUPLED PLASMA (ICP) LOADS

(71) Applicants: Mattson Technology, Inc., Fremont, CA (US); Beijing E-Town Semiconductor Technology Co., Ltd., Beijing (CN)

(72) Inventor: Maolin Long, Santa Clara, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/745,667

(22) Filed: Jun. 17, 2024

(65) Prior Publication Data

US 2024/0339298 A1    Oct. 10, 2024

Related U.S. Application Data

(63) Continuation of application No. 17/726,783, filed on Apr. 22, 2022, now Pat. No. 12,040,159.

(Continued)

(51) Int. Cl.
    *H01J 37/32*      (2006.01)
(52) U.S. Cl.
    CPC ...... *H01J 37/32183* (2013.01); *H01J 37/321* (2013.01); *H01J 37/32165* (2013.01)

(58) Field of Classification Search
CPC ............ H01J 37/3299; H01J 37/32165; H01J 37/32174; H01J 37/32183; H01J 37/32917; H01J 37/32926
See application file for complete search history.

(56) References Cited

U.S. PATENT DOCUMENTS 6,077,384 A    6/2000   Collins et al.
7,838,430 B2   11/2010   Shannon et al.
(Continued)

FOREIGN PATENT DOCUMENTS

CN      102197714 A    9/2011
CN      102438389 A    5/2012
(Continued)

*Primary Examiner* — Tung X Le
(74) *Attorney, Agent, or Firm* — Dority & Manning, P.A.

(57) ABSTRACT

Matching circuitry is disclosed for power generation in a plasma processing apparatus or other application. Matching circuitry is provided in a unitary physical enclosure and is configured to provide impedance matching at multiple different frequencies. For example, in a dual frequency implementation, first and second RF generators can provide electromagnetic energy at first and second respective frequencies in a continuous mode or a pulsed mode to matching circuitry that includes first and second circuit portions. The first circuit portion can include one or more first tuning elements configured to receive RF power at a first frequency and provide impedance matching for a first ICP load (e.g., a primary inductive element). The second circuit portion can include one or more second tuning elements configured to receive RF power at a second different frequency and provide impedance matching for a second ICP load (e.g., a secondary inductive element).

17 Claims, 3 Drawing Sheets

Related U.S. Application Data

(60) Provisional application No. 63/178,090, filed on Apr. 22, 2021.

(56) References Cited

U.S. PATENT DOCUMENTS

| | | |
|---|---|---|
| 8,884,520 B2 | 11/2014 | Kim et al. |
| 9,536,749 B2 | 1/2017 | Marakhtanov et al. |
| 10,297,422 B2 * | 5/2019 | Sato .................. H01J 37/32183 |
| 10,546,724 B2 * | 1/2020 | Radomski ......... H01J 37/32091 |
| 10,821,542 B2 * | 11/2020 | Nelson ................. B23K 20/004 |
| 2005/0133163 A1 | 6/2005 | Shannon et al. |
| 2010/0013572 A1 | 1/2010 | Shannon et al. |
| 2015/0048675 A1 | 2/2015 | Fujii et al. |
| 2015/0301100 A1 | 10/2015 | Valcore, Jr. |
| 2020/0075290 A1 * | 3/2020 | Kawasaki ......... H01J 37/32183 |
| 2021/0118649 A1 | 4/2021 | Huh et al. |
| 2021/0159051 A1 | 5/2021 | Taniguchi et al. |
| 2023/0230804 A1 | 7/2023 | Bhowmick et al. |

FOREIGN PATENT DOCUMENTS

| | | |
|---|---|---|
| CN | 209057396 U | 7/2019 |
| CN | 110945622 A | 3/2020 |

* cited by examiner

DUAL FREQUENCY MATCHING CIRCUIT FOR INDUCTIVELY COUPLED PLASMA (ICP) LOADS

PRIORITY CLAIM

The present application is a continuation of U.S. patent application Ser. No. 17/726,783 filed on Apr. 22, 2022, which claims priority to U.S. Provisional Patent Application No. 63/178,090 filed on Apr. 22, 2021, wherein the entire disclosures of the foregoing applications are hereby incorporated by reference herein.

FIELD

The present disclosure relates generally to matching circuitry that provides integrated matching for multiple frequencies. More particularly, a dual frequency matching circuit can be incorporated into a power generation system or plasma processing apparatus for processing a substrate using a plasma source.

BACKGROUND

RF plasmas are used in the manufacture of devices such as integrated circuits, micromechanical devices, flat panel displays, and other devices. RF plasma sources used in modern plasma etch applications are required to provide a high plasma uniformity and a plurality of plasma controls, including independent plasma profile, plasma density, and ion energy controls. RF plasma sources typically must be able to sustain a stable plasma in a variety of process gases and under a variety of different conditions (e.g. gas flow, gas pressure, etc.). In addition, it is desirable that RF plasma sources produce a minimum impact on the environment by operating with reduced energy demands and reduced EM emission.

Various plasma sources are known for achieving these stringent plasma process requirements. Multi-frequency capacitively coupled plasma (CCP) sources have been used for independent control of ion energy and plasma density. Inductively coupled plasma (ICP) sources combined with RF bias have also been used, for example, to provide independent control of ion energy and plasma density. ICP sources can easily produce high-density plasma using standard 13.56 MHz and lower frequency RF power generators. Indeed, it is known to use multi-coil ICP sources to provide good plasma control and high plasma density.

In known ICP source configurations, RF power is provided at first and second different frequencies for energizing first and second different coils (e.g., a source coil and center coil) within the ICP source. However, existing systems include two separate RF delivery systems for source and center power and are not pulsing capable. Such an arrangement can increase cost, inhibit serviceability, and limit the range of potential applications in plasma processing and other suitable systems.

SUMMARY

Aspects and advantages of the invention will be set forth in part in the following description, or may be obvious from the description, or may be learned through practice of the invention.

One exemplary aspect of the present disclosure is directed to a dual frequency matching circuit that includes first and second input ports, matching circuitry, and first and second output ports. The first input port is configured to receive RF power at a first frequency, while the second input port is configured to receive RF power at a second frequency that is different than the first frequency. The matching circuitry is provided in a unitary physical enclosure and includes respective first and second circuit portions. The first circuit portion includes one or more first tuning elements configured to receive the RF power at the first input port and provide impedance matching for a first load. The second circuit portion includes one or more second tuning elements configured to receive the RF power at the second input port and to provide impedance matching for a second load. The first output port is coupled to the first circuit portion of the matching circuitry and configured to provide a first output signal to the first load at the first frequency. The second output port is coupled to the second circuit portion of the matching circuitry and configured to provide a second output signal to the second load at the second frequency.

Another exemplary aspect of the present disclosure is directed to a power generation system for inductively coupled plasma (ICP) loads. The power generation system includes first and second RF generators, matching circuitry, and a unitary physical enclosure. The first RF generator is configured to provide electromagnetic energy at a first frequency in a continuous mode or a pulsed mode. The second RF generator is configured to provide electromagnetic energy at a second frequency in a continuous mode or a pulsed mode, wherein the second frequency is different than the first frequency. The matching circuitry includes first and second respective circuit portions. The first circuit portion includes one or more first tuning elements configured to receive the electromagnetic energy at the first frequency and provide impedance matching for a first ICP load. The second circuit portion includes one or more second tuning elements configured to receive the electromagnetic energy at the second frequency and provide impedance matching for a second ICP load. The unitary physical enclosure houses the first circuit portion and the second circuit portion.

Yet another exemplary aspect of the present disclosure is directed to a plasma processing apparatus including a processing chamber, a substrate holder, first and second inductive elements, and matching circuitry. The processing chamber has an interior space operable to receive a process gas. The substrate holder is provided in the interior space of the processing chamber and is operable to hold a substrate. The first inductive element and the second inductive element are positioned in different locations relative to the processing chamber. The matching circuitry is provided in a unitary physical enclosure and includes a first circuit portion and a second circuit portion. The first circuit portion of one or more first tuning elements is configured to receive RF power at a first frequency and to provide impedance matching for a first ICP load including the first inductive element. The second circuit portion of one or more second tuning elements is configured to receive RF power at a second frequency and to provide impedance matching for a second ICP load including the second inductive element, wherein the second frequency is different than the first frequency.

Variations and modifications can be made to these exemplary embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION

Figure 1:
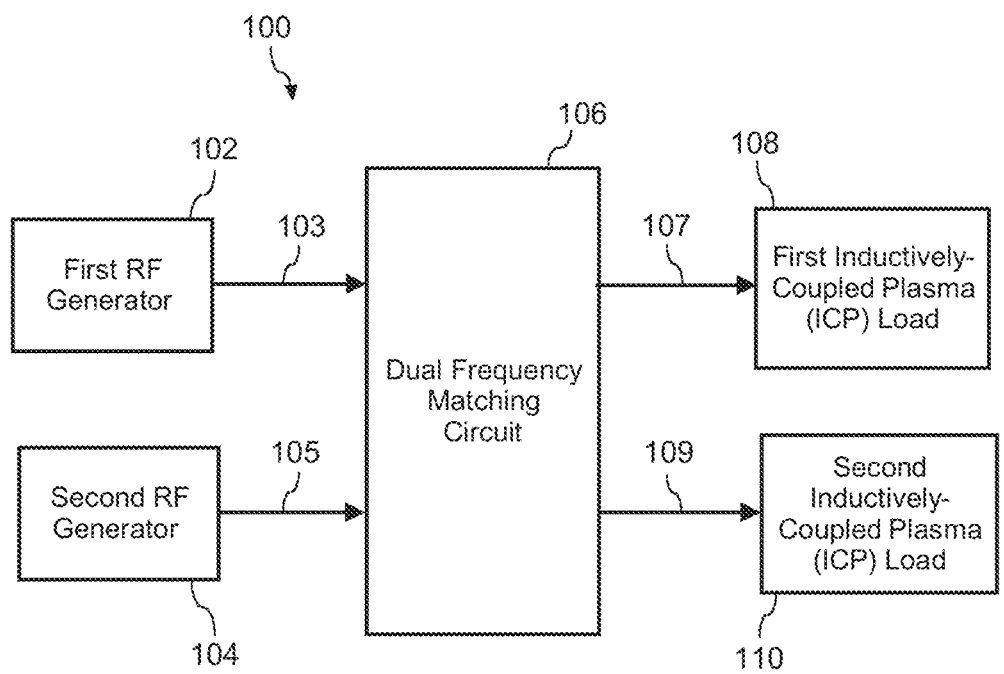
FIG. 1 depicts a block diagram of a power generation system according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to circuits, systems, devices, and related technology for implementing multi-frequency matching for circuit load components (e.g., inductively coupled plasma (ICP) loads). Matching circuitry can be designed to provide at least first and second respective circuit portions that offer impedance matching for radio frequency (RF) power at respective first and second different frequencies. Whereas conventional solutions have two separate RF delivery systems when matching is employed at first and second different RF power levels, the subject technology provides an integrated dual frequency match design that also has the benefits of cost reduction and serviceability improvement by providing impedance matching components for multiple frequencies (e.g., first and second different frequencies) in one physical enclosure.

More particularly, example aspects of the disclosed technology can be directed to a matching circuit that includes a plurality of input ports, matching circuitry provided in a unitary physical enclosure housing all components thereof, and a plurality of output ports. Each input port can be configured to receive RF power at a different respective frequency. The matching circuitry can include a plurality of circuit portions corresponding to the number of different input ports for receiving RF power. Each circuit portion can include one or more tuning elements configured to receive RF power at its respective input port and to provide impedance matching for a corresponding load (e.g., an ICP load). Each output port can be coupled to its respective circuit portion of the matching circuitry and configured to provide a corresponding output signal to its corresponding load at a selected one of the different respective frequencies.

For example, in a dual frequency implementation, a dual frequency matching circuit can include first and second input ports, matching circuitry including first and second circuit portions, and first and second output ports. The first input port can be configured to receive RF power at a first frequency, while a second input port can be configured to receive RF power at a second frequency that is different than the first frequency. The matching circuitry can include first and second respective circuit portions that are housed together in a unitary physical enclosure. The first circuit portion can include one or more first tuning elements configured to receive the RF power at the first input port and to provide impedance matching for a first load (e.g., an ICP load). The second circuit portion can include one or more second tuning elements configured to receive the RF power at the second input port and to provide impedance matching for a second load. The first output port can be coupled to the first circuit portion of the matching circuitry and configured to provide a first output signal to the first load at the first frequency. The second output port can be coupled to the second circuit portion of the matching circuitry and configured to provide a second output signal to the second load at the second frequency.

Although some design and topology examples such as the example above are presented in terms of a dual frequency match design, the principles can be extended to triple frequency or other multi-frequency match implementations.

According to another aspect of the disclosed technology, matching circuitry can be designed for a variety of different load types and corresponding applications. One specific application involves matching circuitry for inductively coupled plasma (ICP) loads. For instance, ICP loads can correspond to first and second inductive elements (e.g., a source coil and a center coil) within a plasma processing apparatus. Although some examples are presented in the context of ICP loads, circuit load components can also correspond to capacitively coupled plasma (CCP) loads, bias applications and/or other suitable applications.

According to another aspect of the disclosed technology, multiple RF generators can be provided to generate the RF power at multiple different frequencies. For example, a first RF generator can be provided to generate RF power at a first frequency, which is directed to a first input port and first circuit portion of the matching circuitry. A second RF generator can be provided to generate RF power at a second frequency, which is directed to a second input port and second circuit portion of the matching circuitry. In some implementations, RF power at the first frequency is provided at a greater power level and frequency than the RF power the second frequency. As one example, RF power at the first frequency can be provided at a power level in a range of about 1 kW to about 5 KW (e.g., about 2 KW) and a frequency in a range of about 12.75 MHz to about 14.25 MHZ (e.g., about 13.56 MHZ), while RF power at the second frequency can be provided at a power level of between about 500 W and about 3 KW (e.g., about 1 kW) and a frequency in a range of about 1.75 MHz to about 2.15 MHZ (e.g., about 2 MHZ).

In some implementations, each RF generator is configured to provide power in a continuous mode and/or a pulsed mode. By including an RF generator capable of selective operation in both continuous and pulsed modes, the disclosed power generation systems and associated matching circuitry can provide enhanced capacity for a broader range of applications. For example, in plasma processing applications, new process applications in nitridation and/or integrated nitridation and anneal require hardware capability of pulsed RF plasma.

According to another aspect of the disclosed technology, the matching circuitry is configured to be housed together in a single unitary physical enclosure. This integrated approach facilitates an overall system design that is more serviceable and compact, especially compared with conventional implementations that require separate and distinct matching circuits for each RF source. In some examples, one or more metal partitions can be provided within the unitary physical enclosure housing all components of the matching circuitry. The number of metal partitions required may depend on whether matching circuitry is provided for a dual frequency, triple frequency, or other multi-frequency approach. Generally speaking, the number of metal partitions is selected to ensure positioning between and physical separation among each circuit portion. In a dual frequency implementation, a metal partition can be positioned between and physically separating the first circuit portion and the second circuit portion.

According to another aspect of the disclosed technology, the respective circuit portions within matching circuitry can include corresponding bypass filter elements configured to filter out residual power at other frequencies than the one intended for a given circuit portion. Referring again to the dual frequency matching circuit example, the matching circuitry can include a first bypass filter element and a second bypass filter element. The first bypass filter element can be provided, for instance, between the first input port and one or more first tuning elements and can be configured to filter out residual power at the second frequency that is leaked to the first circuit portion. The second bypass filter element can be provided, for instance, between the second input port and one or more second tuning elements and can be configured to filter out residual power at the first frequency that is leaked to the second circuit portion. The first and second bypass filter elements can correspond to one or more passive circuit elements, such as but not limited to capacitors and/or inductors. In one particular implementation, for example, the first bypass filter element can be an inductor, and the second bypass filter element can be a capacitor.

According to another aspect of the disclosed technology, the one or more tuning elements within each circuit portion of a matching circuit can take on a variety of particular configurations. In some implementations, each plurality of tuning elements (e.g., one or more first tuning elements in a first circuit portion and one or more second tuning elements in a second circuit portion) can respectively include a shunt capacitor and a series capacitor. In some implementations, each plurality of tuning elements (e.g., one or more first tuning elements in a first circuit portion and one or more second tuning elements in a second circuit portion) can additionally include a respective shunt inductor and a series inductor.

More particularly, in some implementations, each shunt capacitor can be positioned between a bypass filter element and a series capacitor in its corresponding circuit portion. For example, in a dual frequency implementation, a shunt capacitor in a first circuit portion can be positioned between a first bypass filter element and a series capacitor in the first circuit portion. Similarly, a shunt capacitor in the second circuit portion can be positioned between a second bypass filter element and a series capacitor in the second circuit portion.

More particularly, in other implementations, each shunt capacitor can be positioned between a series capacitor in its corresponding circuit portion and an output port. For example, in a dual frequency implementation, a shunt capacitor in the first circuit portion can be positioned between a series capacitor in the first circuit portion and a first output port. Similarly, a shunt capacitor in the second circuit portion can be positioned between a series capacitor in the second circuit portion and a second output port.

According to a still further aspect of the disclosed technology, matching circuitry can include one or more signal monitors configured to monitor various signal levels of RF power provided through the matching circuitry.

In some implementations, for example, each circuit portion of the matching circuitry can include a phase-mag detector coupled to a corresponding input port that is configured to measure the voltage, current, and/or phase angle between the voltage and current of RF power provided to the input port. In a dual frequency implementation, the matching circuitry can include first and second phase-mag detectors. The first phase-mag detector can be coupled between a first input port and first circuit portion and can be configured to measure the RF voltage, the RF current, and phase angle between the RF voltage and the RF current of RF power provided at the first input port at a first frequency. The second phase-mag detector can be coupled between a second input port and second circuit portion and can be configured to measure RF voltage, RF current, and phase angle between the RF voltage and the RF current of the RF power provided at the second input port at the second frequency.

In other implementations, for example, each circuit portion of the matching circuitry can include a voltage-current (VI) probe coupled to a corresponding output port that is configured to provide measure voltage and current provided to the output port. In a dual frequency implementation, the matching circuitry can include first and second VI probes. A first VI probe can be coupled between the first circuit portion and a first output port and can be configured to measure RF voltage and RF current of the first output signal. A second VI probe can be coupled between the second circuit portion and a second output port and can be configured to measure RF voltage and RF current of the second output signal.

Another example implementation of the disclosed technology corresponds to a power generation system for loads such as inductively coupled plasma (ICP) loads. Such a power generation system can include multiple RF generators, each RF generator configured to provide electromagnetic energy at a different frequency. For instance, in a dual frequency implementation, a power generation system can include a first RF generator configured to provide electromagnetic energy at a first frequency and a second RF generator configured to provide electromagnetic energy at a second frequency that is different than the first frequency. In some examples, each RF generator can be configured to operate in a continuous mode and/or a pulsed mode. For instance, a mode selection controller can be coupled to each RF generator and configured to provide electronic signal control for toggling between a continuous mode or a pulsed mode, depending on the load application.

Referring still to example implementations of the disclosed technology, a power generation system can further include matching circuitry that includes multiple circuit portions, one circuit portion for each RF generator provided in the power generation system. Each of the multiple circuit portions can include one or more tuning elements configured to receive RF power at a respective frequency level and to provide impedance matching for a corresponding load (e.g., an ICP load). For example, in dual frequency implementations, matching circuitry can include first and second circuit portions. A first circuit portion can include one or more first tuning elements that are configured to receive the electromagnetic energy at the first frequency and provide impedance matching for a first ICP load. A second circuit portion can include one or more second tuning elements that are configured to receive the electromagnetic energy at the second frequency and provide impedance matching for a second ICP load. The matching circuitry can further include a unitary physical enclosure housing all circuit portions (e.g., the first circuit portion and second circuit portion. A metal partition can be optionally included to physically separate the circuit portions within the unitary physical structure.

A still further example implementation of the disclosed technology corresponds to a plasma processing apparatus. The plasma processing apparatus can include a processing chamber having an interior space operable to receive a process gas and a substrate holder in the interior of the processing chamber operable to hold a substrate. The plasma processing apparatus can include first and second ICP loads. For example, the first and second ICP loads can respectively include first and second inductive elements positioned in different locations relative to the processing chamber.

The first inductive element can correspond, for example, to a primary coil or source coil within an ICP application, while the second conductive element can correspond, for example, to a secondary coil or center coil within an ICP application. Matching circuitry can be provided in a unitary physical enclosure and configured to provide tuned power to the first and second inductive elements. For instance, a first circuit portion of one or more first tuning elements can be configured to receive RF power at a first frequency and to provide impedance matching for a first ICP load comprising the first inductive element. A second circuit portion of one or more second tuning elements can be configured to receive RF power at a second frequency and to provide impedance matching for a second ICP load comprising the second inductive element, wherein the second frequency is different than the first frequency.

Referring still to example embodiments of a plasma processing apparatus, matching circuitry can be designed to provide integrated tuned power to multiple inductive elements, such as a primary coil and a secondary coil. The primary coil can be separated from the process chamber by a Faraday shield. The secondary coil can be separated from the primary coil by an electromagnetic shield to prevent cross-talk between the coils. In a particular implementation, different RF frequencies are selected for use on the first and second inductive elements. The frequencies are selected to reduce cross-talk between the first and second inductive elements in the plasma, providing for enhanced independent control of the inductive elements.

Systems and methods according to example aspects of the present disclosure can provide for a number of technical effects and benefits, including but not limited to improvements in power generation systems and plasma processing apparatuses. For instance, example aspects of the present disclosure can provide for an enhanced range of RF power applications, including ICP loads, CCP loads, bias applications and others. In addition, because RF generators and corresponding matching circuitry can be designed for selectable operation in continuous mode and pulsed mode, utilization in plasma processing applications including nitridation and/or integrated nitridation and anneal can be realized. Still further, integration of matching circuitry tuned to multiple different frequencies within a single unitary structure can reduce overall system cost and make the design both more compact and more easily serviceable.

FIG. 1 depicts a block diagram of a power generation system according to an exemplary embodiment of the present disclosure. More particularly, power generation system 100 is designed to service load components that operate at multiple different frequencies. In the particular example of FIG. 1, a dual frequency implementation is illustrated, although the components and concepts can be extended to cover triple frequency or other multi-frequency configurations. Power generation system 100 can include a first RF generator 102 configured to generate first RF power 103 that provides electromagnetic energy at a first frequency. Power generation system 100 can also include a second RF generator 104 configured to generate second RF power 105 that provides electromagnetic energy at a second frequency that is different than the first frequency.

In some examples, the first frequency and/or power level of first RF power 103 is greater than the second frequency and/or power level of second RF power 105. For example, in some specific implementations, as one example, first RF power 103 at the first frequency can be provided at a power level in a range of about 1 kW to about 5 KW (e.g., about 2 kW) and a frequency in a range of about 12.75 MHz and about 14.25 MHZ (e.g., about 13.56 MHz), while second RF power 105 at the second frequency can be provided at a power level in a range of about 500 W to about 3 KW (e.g., about 1 kW) and a frequency in a range of about 1.75 MHz to about 2.15 MHz (e.g., 2 MHZ).

In some examples, the first RF generator 102 and/or the second RF generator 104 can be configured to operate in a continuous mode and/or a pulsed mode. For instance, a mode selection controller can be coupled to each of the first RF generator 102 and/or second RF generator 104 and can be configured to provide electronic signal control for toggling between a continuous mode or a pulsed mode, depending on the load application.

Referring still to FIG. 1, the first RF power 103 and second RF power 105 can be provided to a dual frequency matching circuit 106 that includes multiple circuit portions, one circuit portion for each RF generator provided in the power generation system 100. Because FIG. 1 depicts a dual frequency implementation, matching circuit 106 can include first and second circuit portions that each include one or more tuning elements configured to receive RF power at a respective frequency level and to provide impedance matching for a corresponding load (e.g., a first ICP load 108 and a second ICP load 110). For instance, matching circuit 106 can include a first circuit portion of one or more first tuning elements that are configured to receive first RF power 103 and provide impedance matching for first ICP load 108. Matching circuit 106 can further include a second circuit portion of one or more second tuning elements that are configured to receive second RF power 105 and provide impedance matching for second ICP load 110. Matching circuit 106 can thus generate a first output signal 107 provided to first ICP load 108 and a second output signal 109 provided to second ICP load 110. Additional example implementations of matching circuit 106 are illustrated in and described with reference to FIGS. 2-4, respectively.

In some implementations, such as those involving a plasma processing apparatus, first ICP load 108 can include a primary inductive element (e.g., a source coil), while second ICP load 110 can include a secondary inductive element (e.g., a center coil), such as described with reference to FIG. 5. Although FIG. 1 depicts a first ICP load 108 and second ICP load 110, it should be appreciated that matching circuit 106 can be designed for a variety of different load types and corresponding applications. Although some examples are presented in the context of ICP loads, circuit load components can also correspond to capacitively coupled plasma (CCP) loads, bias applications and/or other suitable applications.

Figure 2:
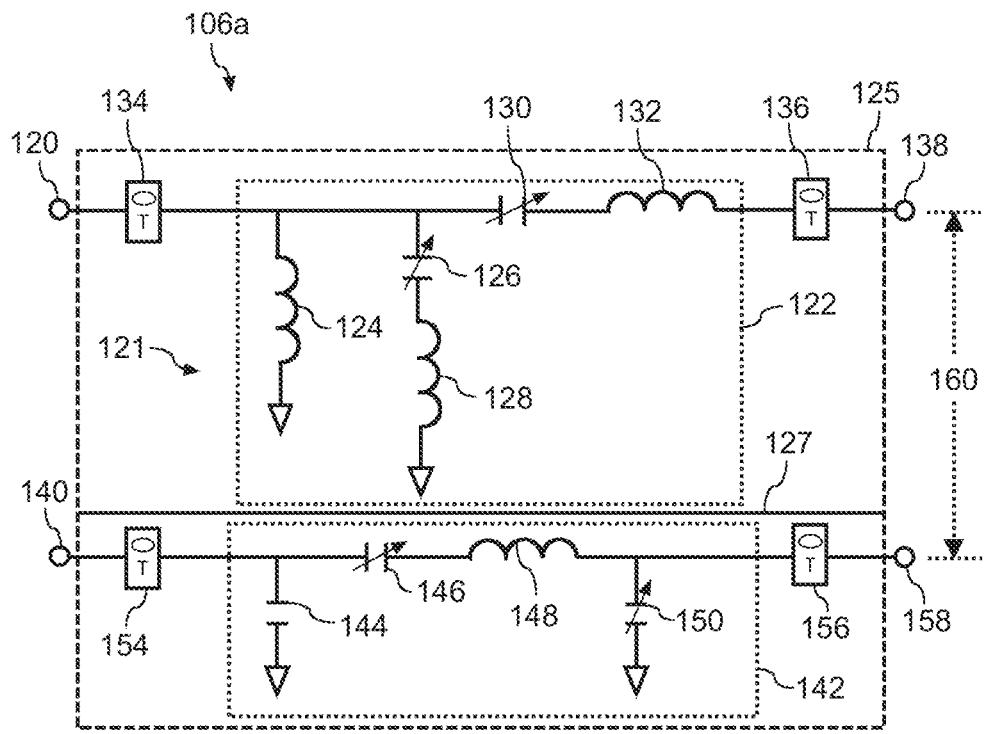
FIG. 2 depicts a first exemplary dual frequency matching circuit according to an exemplary embodiment of the present disclosure.

FIG. 2 depicts a first exemplary dual frequency matching circuit 106a according to an exemplary embodiment of the present disclosure. Dual frequency matching circuit 106a includes a first input port 120, matching circuitry 121, a first circuit portion 122, a first bypass filter element 124, a physical enclosure 125, a first shunt capacitor 126, a first shunt inductor 128, a first series capacitor 130, a first series inductor 132, a first phase-mag detector 134, a first VI probe 136, a first output port 138, a second input port 140, a second circuit portion 142, a second bypass filter element 144, a second series capacitor 146, a second series inductor 148, a second shunt capacitor 150, a second phase-mag detector 154, a second VI probe 156, a second output port 158 and distance 160.

The first input port 120 can be configured to receive RF power at a first frequency (e.g., first RF power 103 of FIG. 1), while second input port 140 can be configured to receive RF power at a second frequency that is different than the first frequency (e.g., RF power 105 of FIG. 1). The dual frequency matching circuit 106a can include matching circuitry 121 that includes a first circuit portion 122 and second circuit portion 142 that are housed together in a unitary physical enclosure 125. The first circuit portion 122 can include one or more first tuning elements (e.g., first shunt capacitor 126, first shunt inductor 128, first series capacitor 130, and first series inductor 132) configured to receive RF power at the first input port 120 and to provide impedance matching for a first load (e.g., ICP load 108 of FIG. 1). The second circuit portion 142 can include one or more second tuning elements (e.g., second series capacitor 146, second series inductor 148, and second shunt capacitor 150) configured to receive RF power at the second input port 140 and to provide impedance matching for a second load (e.g., ICP load 110 of FIG. 1). The first output port 138 can be coupled to the first circuit portion 122 of the matching circuitry 121 and configured to provide a first output signal to the first load (e.g., ICP load 108 of FIG. 1) at the first frequency. The second output port 158 can be coupled to the second circuit portion 142 of the matching circuitry 121 and configured to provide a second output signal to the second load (e.g., ICP load 110 of FIG. 1) at the second frequency. In some implementations, first output port 138 and second output port 158 can be spaced apart from one another at a distance 160 that is selected in a range of between about 1 inch to about 35 inches.

Referring still to FIG. 2, components of the matching circuit 106a are configured to be housed together in a single unitary physical enclosure 125. For example, physical enclosure 125 can house the first phase-mag detector 134, second phase-mag detector 154, matching circuitry 121 including the first circuit portion 122 and second circuit portion 142, first VI probe 136 and second VI probe 156. In some examples, one or more metal partitions 127 can be provided within the unitary physical enclosure 125 to ensure positioning between and physical separation among each circuit portion. In the dual frequency implementation of FIG. 2, a metal partition 127 can be positioned between and physically separating the first circuit portion 122 and the second circuit portion 142.

According to another aspect of the disclosed technology, the first circuit portion 122 and second circuit portion 142 within matching circuitry 121 can include corresponding bypass filter elements (e.g., first bypass filter element 124 and second bypass filter element 144) configured to filter out residual power at other frequencies than the one intended for a given circuit portion. The first bypass filter element 124 can be provided, for instance, between the first input port 120 and one or more first tuning elements and can be configured to filter out residual power at the second frequency (e.g., about 2 MHZ) that is leaked to the first circuit portion 122. The second bypass filter element 144 can be provided, for instance, between the second input port 140 and one or more second tuning elements and can be configured to filter out residual power at the first frequency (e.g., about 13.56 MHZ) that is leaked to the second circuit portion 142. The first bypass filter element 124 and second bypass filter element 144 can respectively correspond to one or more passive circuit elements, such as but not limited to capacitors and/or inductors. In one particular implementation, for example, the first bypass filter element 124 can be an inductor, and the second bypass filter element 144 can be a capacitor.

Referring still to FIG. 2, the one or more tuning elements within each first circuit portion 122 and second circuit portion 142 of matching circuit 106a can take on a variety of particular configurations. For example, the one or more first tuning elements in first circuit portion 122 can include first shunt capacitor 126 and first series capacitor 130, one or both of which may correspond to variable capacitors. In some implementations, the one or more first tuning elements in first circuit portion 122 can include first shunt inductor 128 and first series inductor 132. First shunt capacitor 126 and first shunt inductor 128 are connected in series and positioned between first bypass filter element 124 and first series capacitor 130 in first circuit portion 122. First series capacitor 130 is connected in series with first series inductor 132, both of which are positioned between the first shunt capacitor 126 and first output port 138. Example ranges of values for the components in first circuit portion 122 can include an inductance value between about 1 µH and about 5 µH for the first bypass filter element 124, a capacitance value between about 20 pF and about 2,000 pF for first shunt capacitor 126, an inductance value between about 0 µH and about 0.5 µH for first shunt inductor 128, a capacitance value between about 5 pF and about 500 pF for first series capacitor 130, and an inductance value of between about 0 µH and about 1 µH for first series inductor 132.

One or more second tuning elements in second circuit portion 142 can include second shunt capacitor 150 and second series capacitor 146, one or both of which may correspond to variable capacitors. In some implementations the one or more second tuning elements in second circuit portion 142 can include second series inductor 148. Second series capacitor 146 is connected in series with second series inductor 148, both of which are positioned between the second bypass filter element 144 and second shunt capacitor 150. Example ranges of values for the components in second circuit portion 142 can include a capacitance value between about 0 pF and about 500 pF for the second bypass filter element 144, a capacitance value between about 50 pF and about 10 nF for second series capacitor 146, and a capacitance value between about 50 pF and about 10 nF for second shunt capacitor 150.

According to a still further aspect of the disclosed technology, matching circuit 106a can include one or more signal monitors configured to monitor various signal levels of RF power provided through the matching circuitry. For example, a first phase-mag detector 134 can be coupled between first input port 120 and first circuit portion 122 and can be configured to measure RF voltage, RF current, and phase angle between the RF voltage and the RF current of RF power provided at the first input port 120 at a first frequency. A second phase-mag detector 154 can be coupled between second input port 140 and second circuit portion 142 and can be configured to measure RF voltage, RF current, and phase angle between the RF voltage and the RF current of the RF power provided at the second input port 140 at the second frequency. A first voltage-current (VI) probe 136 can be coupled between the first circuit portion 122 (e.g., between first series inductor 132) and first output port 138 and can be configured to measure RF voltage and RF current of the first output signal (e.g., first output signal 107 of FIG. 1). A second VI probe 156 can be coupled between the second circuit portion 142 (e.g., between second shunt capacitor 150) and second output port 158 and can be configured to measure RF voltage and RF current of the second output signal (e.g., second output signal 109 of FIG. 1).

In some implementations, magnitude and/or phase values determined by the various signal monitors (e.g., first phase-mag detector 134, second phase-mag detector 154, first VI probe 136, and second VI probe 156) can be periodically or continuously evaluated to ensure proper values for the frequency tuning elements within matching circuit 106a. The values of some tuning elements (e.g., of variable capacitors such as first shunt capacitor 126, first series capacitor 130, second series capacitor 146, and second shunt capacitor 150) can be periodically tuned based on the values determined by the signal monitor(s).

Figure 3:
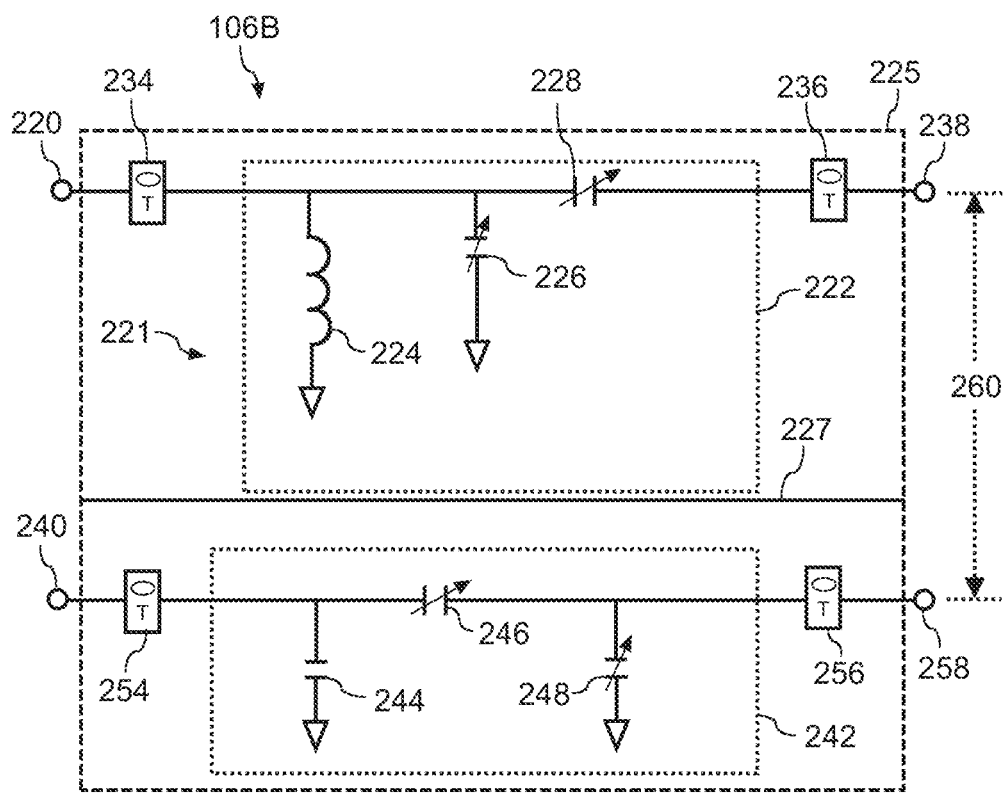
FIG. 3 depicts a second exemplary dual frequency matching circuit according to an exemplary embodiment of the present disclosure.

FIG. 3 depicts a second exemplary dual frequency matching circuit 106b according to an exemplary embodiment of the present disclosure. Dual frequency matching circuit 106b includes a first input port 220, matching circuitry 221, a first circuit portion 222, a first bypass filter element 224, a physical enclosure 225, a first shunt capacitor 226, a first series capacitor 228, a first phase-mag detector 234, a first VI probe 236, a first output port 238, a second input port 240, a second circuit portion 242, a second bypass filter element 244, a second series capacitor 246, a second shunt capacitor 248, a second phase-mag detector 254, a second VI probe 256, a second output port 258 and distance 260.

The first input port 220 can be configured to receive RF power at a first frequency (e.g., first RF power 103 of FIG. 1), while second input port 240 can be configured to receive RF power at a second frequency that is different than the first frequency (e.g., RF power 105 of FIG. 1). The dual frequency matching circuit 106b can include matching circuitry 221 that includes a first circuit portion 222 and second circuit portion 242 that are housed together in a unitary physical enclosure 225. The first circuit portion 222 can include one or more first tuning elements (e.g., first shunt capacitor 226 and first series capacitor 228) configured to receive RF power at the first input port 220 and to provide impedance matching for a first load (e.g., ICP load 108 of FIG. 1). The second circuit portion 242 can include one or more second tuning elements (e.g., second series capacitor 246 and second shunt capacitor 248) configured to receive RF power at the second input port 240 and to provide impedance matching for a second load (e.g., ICP load 110 of FIG. 1). The first output port 238 can be coupled to the first circuit portion 222 of the matching circuitry 221 and configured to provide a first output signal to the first load (e.g., ICP load 108) at the first frequency. The second output port 258 can be coupled to the second circuit portion 242 of the matching circuitry 221 and configured to provide a second output signal to the second load (e.g., ICP load 110) at the second frequency. In some implementations, first output port 238 and second output port 258 can be spaced apart from one another at a distance 260 that is selected in a range of between about 1 inch to about 35 inches.

Referring still to FIG. 3, components of the matching circuit 106b are configured to be housed together in a single unitary physical enclosure 225. For example, physical enclosure 225 can house the first phase-mag detector 234, second phase-mag detector 254, matching circuitry 221 including the first circuit portion 222 and second circuit portion 242, first VI probe 236 and second VI probe 256. In some examples, one or more metal partitions 227 can be provided within the unitary physical enclosure 225 to ensure positioning between and physical separation among each circuit portion. In the dual frequency implementation of FIG. 3, a metal partition 227 can be positioned between and physically separating the first circuit portion 222 and the second circuit portion 242.

According to another aspect of the disclosed technology, the first circuit portion 222 and second circuit portion 242 within matching circuitry 221 can include corresponding bypass filter elements (e.g., first bypass filter element 224 and second bypass filter element 244) configured to filter out residual power at other frequencies than the one intended for a given circuit portion. The first bypass filter element 224 can be provided, for instance, between the first input port 220 and one or more first tuning elements and can be configured to filter out residual power at the second frequency (e.g., about 2 MHZ) that is leaked to the first circuit portion 222. The second bypass filter element 244 can be provided, for instance, between the second input port 240 and one or more second tuning elements and can be configured to filter out residual power at the first frequency (e.g., about 13.56 MHZ) that is leaked to the second circuit portion 242. The first bypass filter element 224 and second bypass filter element 244 can respectively correspond to one or more passive circuit elements, such as but not limited to capacitors and/or inductors. In one particular implementation, for example, the first bypass filter element 224 can be an inductor, and the second bypass filter element 244 can be a capacitor.

Referring still to FIG. 3, the one or more tuning elements within each first circuit portion 222 and second circuit portion 242 of matching circuit 106b can take on a variety of particular configurations. For example, the one or more first tuning elements in first circuit portion 222 can include first shunt capacitor 226 and first series capacitor 228, one or both of which may correspond to variable capacitors. First shunt capacitor 226 is positioned in parallel to first bypass filter element 224 and before first series capacitor 228. First series capacitor 228 is positioned between first shunt capacitor 226 and output port 138. Example ranges of values for the components in first circuit portion 222 can include an inductance value between about 1 μH and about 5 μH for the first bypass filter element 224, a capacitance value between about 20 pF and about 2,000 pF for first shunt capacitor 226, and a capacitance value between about 5 pF and about 500 pF for first series capacitor 228.

One or more second tuning elements in second circuit portion 242 can include second shunt capacitor 248 and second series capacitor 246, one or both of which may correspond to variable capacitors. Second shunt capacitor 248 is positioned in parallel to second bypass filter element 244, with second series capacitor 246 positioned therebetween. Example ranges of values for the components in second circuit portion 242 can include a capacitance value between about 0 pF and about 500 pF for the second bypass filter element 244, a capacitance value between about 50 pF and about 10 nF for second series capacitor 246, and a capacitance value between about 50 pF and about 10 nF for second shunt capacitor 248.

According to a still further aspect of the disclosed technology, matching circuit 106b can include one or more signal monitors configured to monitor various signal levels of RF power provided through the matching circuitry. For example, a first phase-mag detector 234 can be coupled between first input port 220 and first circuit portion 222 and can be configured to measure RF voltage, RF current, and phase angle between the RF voltage and the RF current of RF power provided at the first input port 220 at a first frequency. A second phase-mag detector 254 can be coupled between second input port 240 and second circuit portion 242 and can be configured to measure RF voltage, RF current, and phase angle between the RF voltage and the RF current of the RF power provided at the second input port 240 at the second frequency. A first voltage-current (VI) probe 236 can be coupled between the first circuit portion 222 (e.g., between first series capacitor 228) and first output port 238 and can be configured to measure RF voltage and RF current of the first output signal (e.g., first output signal 107 of FIG. 1). A second VI probe 256 can be coupled between the second circuit portion 242 (e.g., between second shunt capacitor 248) and second output port 258 and can be configured to measure RF voltage and RF current of the second output signal (e.g., second output signal 109 of FIG. 1).

In some implementations, magnitude and/or phase values determined by the various signal monitors (e.g., first phase-mag detector 234, second phase-mag detector 254, first VI probe 236, and second VI probe 256) can be periodically or continuously evaluated to ensure proper values for the frequency tuning elements within matching circuit 106b. The values of some tuning elements (e.g., of variable capacitors such as first shunt capacitor 226, first series capacitor 228, second series capacitor 246, and second shunt capacitor 248) can be periodically tuned based on the values determined by the signal monitor(s).

Figure 4:
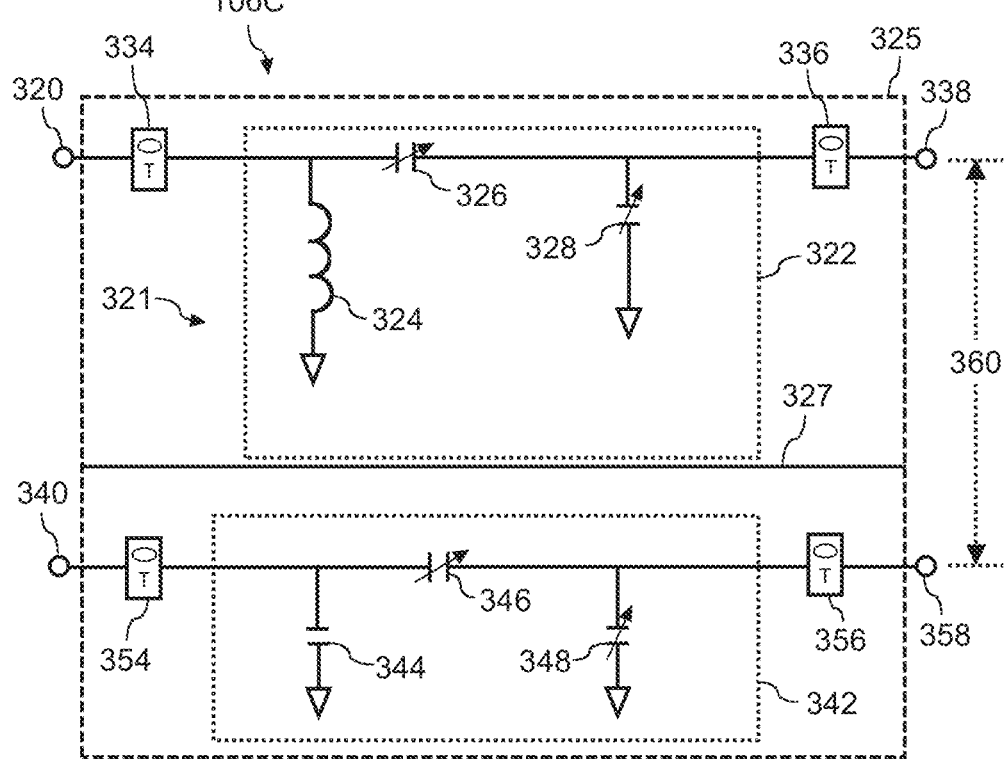
FIG. 4 depicts a third exemplary dual frequency matching circuit according to an exemplary embodiment of the present disclosure.

FIG. 4 depicts a third exemplary dual frequency matching circuit 106c according to an exemplary embodiment of the present disclosure. Dual frequency matching circuit 106c includes a first input port 320, matching circuitry 321, a first circuit portion 322, a first bypass filter element 324, a physical enclosure 325, a first series capacitor 326, a first shunt capacitor 328, a first phase-mag detector 334, a first VI probe 336, a first output port 338, a second input port 340, a second circuit portion 342, a second bypass filter element 344, a second series capacitor 346, a second shunt capacitor 348, a second phase-mag detector 354, a second probe 356, a second output port 358 and distance 360.

The first input port 320 can be configured to receive RF power at a first frequency (e.g., first RF power 103 of FIG. 1), while second input port 340 can be configured to receive RF power at a second frequency that is different than the first frequency (e.g., RF power 105 of FIG. 1). The dual frequency matching circuit 106c can include matching circuitry 321 that includes a first circuit portion 322 and second circuit portion 342 that are housed together in a unitary physical enclosure 325. The first circuit portion 322 can include one or more first tuning elements (e.g., first series capacitor 326 and first shunt capacitor 328) configured to receive RF power at the first input port 320 and to provide impedance matching for a first load (e.g., ICP load 108 of FIG. 1). The second circuit portion 342 can include one or more second tuning elements (e.g., second series capacitor 346 and second shunt capacitor 348) configured to receive RF power at the second input port 340 and to provide impedance matching for a second load (e.g., ICP load 110 of FIG. 1). The first output port 338 can be coupled to the first circuit portion 322 of the matching circuitry 321 and configured to provide a first output signal to the first load (e.g., ICP load 108 of FIG. 1) at the first frequency. The second output port 358 can be coupled to the second circuit portion 342 of the matching circuitry 321 and configured to provide a second output signal to the second load (e.g., ICP load 110 of FIG. 1) at the second frequency. In some implementations, first output port 338 and second output port 358 can be spaced apart from one another at a distance 360 that is selected in a range of between about 1 inch to about 35 inches.

Referring still to FIG. 4, components of the matching circuit 106c are configured to be housed together in a single unitary physical enclosure 325. For example, physical enclosure 325 can house the first phase-mag detector 334, second phase-mag detector 354, matching circuitry 321 including the first circuit portion 322 and second circuit portion 342, first VI probe 336 and second VI probe 356. In some examples, one or more metal partitions 327 can be provided within the unitary physical enclosure 325 to ensure positioning between and physical separation among each circuit portion. In the dual frequency implementation of FIG. 4, a metal partition 327 can be positioned between and physically separating the first circuit portion 322 and the second circuit portion 342.

According to another aspect of the disclosed technology, the first circuit portion 322 and second circuit portion 342 within matching circuitry 321 can include corresponding bypass filter elements (e.g., first bypass filter element 324 and second bypass filter element 344) configured to filter out residual power at other frequencies than the one intended for a given circuit portion. The first bypass filter element 324 can be provided, for instance, between the first input port 320 and one or more first tuning elements and can be configured to filter out residual power at the second frequency (e.g., about 2 MHZ) that is leaked to the first circuit portion 322. The second bypass filter element 344 can be provided, for instance, between the second input port 340 and one or more second tuning elements and can be configured to filter out residual power at the first frequency (e.g., about 13.56 MHZ) that is leaked to the second circuit portion 342. The first bypass filter element 324 and second bypass filter element 344 can respectively correspond to one or more passive circuit elements, such as but not limited to capacitors and/or inductors. In one particular implementation, for example, the first bypass filter element 324 can be an inductor, and the second bypass filter element 344 can be a capacitor.

Referring still to FIG. 4, the one or more tuning elements within each first circuit portion 322 and second circuit portion 342 of matching circuit 106c can take on a variety of particular configurations. For example, the one or more first tuning elements in first circuit portion 322 can include first series capacitor 326 and first shunt capacitor 328, one or both of which may correspond to variable capacitors. First shunt capacitor 328 in the first circuit portion 322 is positioned between the series capacitor 326 in the first circuit portion 322 and the first output port 338. Example ranges of values for the components in first circuit portion 322 can include an inductance value between about 1 µH and about 5 µH for the first bypass filter element 324, a capacitance value between about 20 pF and about 2,000 pF for first shunt capacitor 328, and a capacitance value between about 5 pF and about 500 pF for first series capacitor 326.

One or more second tuning elements in second circuit portion 342 can include second shunt capacitor 348 and second series capacitor 346, one or both of which may correspond to variable capacitors. Second shunt capacitor 348 in the second circuit portion 342 is positioned between the series capacitor 346 in the second circuit portion 342 and the second output port 358. Example ranges of values for the components in second circuit portion 342 can include a capacitance value between about 0 pF and about 500 pF for the second bypass filter element 344, a capacitance value between about 50 pF and about 10 nF for second series capacitor 346, and a capacitance value between about 50 pF and about 10 nF for second shunt capacitor 348.

According to a still further aspect of the disclosed technology, matching circuit 106c can include one or more signal monitors configured to monitor various signal levels of RF power provided through the matching circuitry. For example, a first phase-mag detector 334 can be coupled between first input port 320 and first circuit portion 322 and can be configured to measure RF voltage, RF current, and phase angle between the RF voltage and the RF current of RF power provided at the first input port 320 at a first frequency. A second phase-mag detector 354 can be coupled between second input port 340 and second circuit portion 342 and can be configured to measure RF voltage, RF current, and phase angle between the RF voltage and the RF current of the RF power provided at the second input port 340 at the second frequency. A first voltage-current (VI) probe 336 can be coupled between the first circuit portion 322 (e.g., between first shunt capacitor 328) and first output port 338 and can be configured to measure RF voltage and RF current of the first output signal (e.g., first output signal 107 of FIG. 1). A second VI probe 356 can be coupled between the second circuit portion 342 (e.g., between second shunt capacitor 348) and second output port 358 and can be configured to measure RF voltage and RF current of the second output signal (e.g., second output signal 109 of FIG. 1).

In some implementations, magnitude and/or phase values determined by the various signal monitors (e.g., first phase-mag detector 334, second phase-mag detector 354, first VI probe 336, and second VI probe 356) can be periodically or continuously evaluated to ensure proper values for the frequency tuning elements within matching circuit 106c. The values of some tuning elements (e.g., of variable capacitors such as first series capacitor 326, first shunt capacitor 328, second series capacitor 346, and second shunt capacitor 348) can be periodically tuned based on the values determined by the signal monitor(s).

Figure 5:
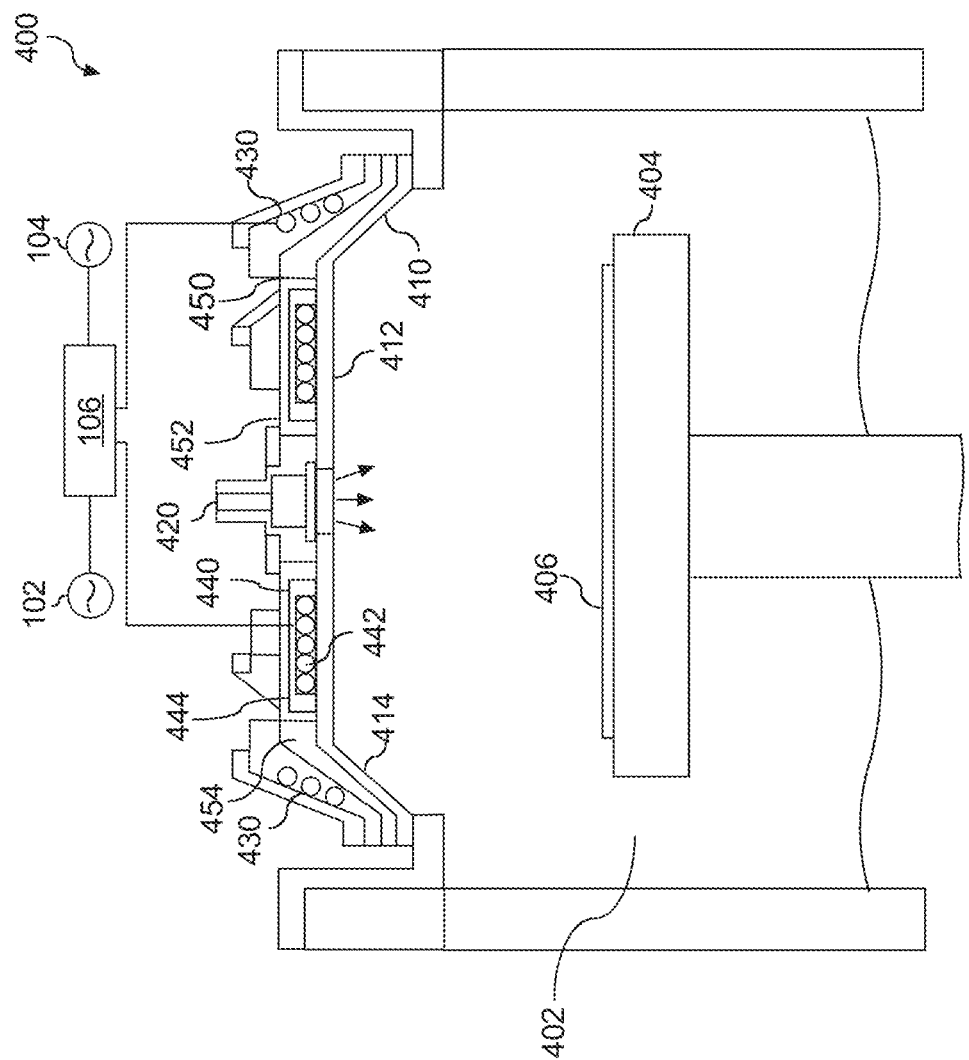
FIG. 5 depicts a plasma processing apparatus according to an exemplary embodiment of the present disclosure.

FIG. 5 depicts a plasma processing apparatus 400 according to an exemplary embodiment of the present disclosure. The plasma processing apparatus 400 includes a processing chamber defining an interior space 402. A pedestal or substrate holder 404 is used to support a substrate 406, such as a semiconductor wafer, within the interior space 402. A dielectric window 410 is located above the substrate holder 404. The dielectric window 410 includes a relatively flat central portion 412 and an angled peripheral portion 414.

The dielectric window 410 includes a space in the central portion 412 for a showerhead 420 to feed process gas into the interior space 402.

The plasma processing apparatus 400 further includes a plurality of inductive elements, such as primary inductive element 430 and secondary inductive element 440, for generating an inductive plasma in the interior space 402. The inductive elements 430, 440 can respectively include a coil or antenna element that when supplied with RF power, induces a plasma in the process gas in the interior space 402 of plasma processing apparatus 400. For instance, a first RF generator 102 can be configured to provide electromagnetic energy through a matching circuit 106 to the primary inductive element 430. A second RF generator 104 can be configured to provide electromagnetic energy through the same matching circuit 106 to the secondary inductive element 440.

While the present disclosure makes reference to a primary inductive element 430 and a secondary inductive element 440, those of ordinary skill in the art, should appreciate that the terms primary and secondary are used for convenience purposes only. The secondary inductive element can be operated independent of the primary element, and vice versa. Still further, additional inductive elements (e.g., a tertiary inductive element) can be included in plasma processing apparatus 400, with corresponding matching circuitry provided within matching circuit 106.

According to aspects of the present disclosure, the plasma processing apparatus 400 can include a metal shield portion 452 disposed around the secondary inductive element 440. As discussed in more detail below, metal shield portion 452 separates the primary inductive element 430 and the secondary inductive element 440 to reduce cross-talk between the inductive elements 430, 440. Plasma processing apparatus 400 can further include a Faraday shield portion 454 disposed between the primary inductive element 430 and the dielectric window 410. Faraday shield portion 454 can be a slotted metal shield that reduces capacitive coupling between the primary inductive element 430 and the interior space 402. As illustrated, Faraday shield portion 454 can fit over the angled portion of the dielectric window 410.

In a particular embodiment, metal shield portion 452 and Faraday shield portion 454 can form a unitary shield body 450 for case of manufacturing and other purposes. FIG. 5 illustrates a unitary shield body 450 for use in an example implementation of metal shield portion 452 and Faraday shield portion 454 according to an exemplary embodiment of the present disclosure. The multi-turn coil of the primary inductive element 430 can be located adjacent the Faraday shield portion 454 of the unitary shield body 450. The secondary inductive element 440 can be located proximate the metal shield portion 452 of unitary shield body 450, such as between the metal shield portion 452 and the dielectric window 410.

The arrangement of the primary inductive element 430 and the secondary inductive element 440 on opposite sides of the metal shield portion 452 allows the primary inductive element 430 and secondary inductive element 440 to have distinct structural configurations and to perform different functions. For instance, the primary inductive element 430 can include a multi-turn coil located adjacent a peripheral portion of the process chamber. The primary inductive element 430 can be used for basic plasma generation and reliable start during the inherently transient ignition stage. The primary inductive element 430 can be coupled to a powerful RF generator 102 and can be operated at an increased RF frequency, such as at about 13.56 MHZ.

The secondary inductive element 440 can be used for corrective and supportive functions and for improving the stability of the plasma during steady state operation. Since the secondary inductive element 440 can be used primarily for corrective and supportive functions and improving stability of the plasma during steady state operation, the secondary inductive element 440 does not have to be coupled to as powerful an RF generator as the primary inductive element 430 and can be designed differently and cost effectively to overcome the difficulties associated with previous designs. As discussed in detail below, the secondary inductive element 440 can also be coupled to an RF generator 104 and configured to operate at a lower frequency, such as at about 2 MHZ, allowing the secondary inductive element 440 to be very compact and to fit in a limited space on top of the dielectric window.

According to exemplary aspects of the present disclosure, the primary inductive element 430 and the secondary inductive element 440 are operated at different frequencies. The frequencies are sufficiently different to reduce cross-talk between the primary inductive element 430 and the secondary inductive element 440. For instance, the frequency applied to the primary inductive element 430 from matching circuit 106 can be at least about 1.5 times greater than the frequency applied to the secondary inductive element 440. In a particular embodiment, the frequency applied to the primary inductive element 430 can be in a range of about 12.75 MHz and about 14.25 MHZ (e.g., about 13.56 MHZ) and the frequency applied to the secondary inductive element 440 can be in the range of about 1.75 MHz to about 2.15 MHz (e.g., about 2 MHZ). Other suitable frequencies can also be used, such as about 400 kHz, about 4 MHZ, and about 27 MHz. While the present disclosure is discussed with reference to the primary inductive element 430 being operated at a higher frequency relative to the secondary inductive element 440, those of ordinary skill in the art, using the disclosures provided herein, should understand that the secondary inductive element 440 could be operated at the higher frequency without deviating from the scope of the present disclosure.

Due to the different frequencies that can be applied to the primary inductive element 430 and the secondary inductive element 440, there is reduced interference between the inductive elements 430, 440. More particularly, the only interaction in the plasma between the inductive elements 430, 440 is through plasma density. Accordingly, there is no need for phase synchronization between the RF generator 102 coupled to the primary inductive element 430 and the RF generator 104 coupled to the secondary inductive element 440. Power control is independent between the inductive elements. Additionally, since the inductive elements 430, 440 are operating at distinctly different frequencies, it is practical to use frequency tuning of the RF generators 102, 104 in an integrated matching circuit 106 for matching the power delivery into the plasma, greatly simplifying the design, cost, and serviceability of the overall system.

Compared to the primary inductive element 430 operated at 13.56 MHz, the secondary inductive element 440 can be operated at about 2 MHz and can have a larger number of turns and thus operate at lower current magnitude $$I_{coil} \propto P_{pl}/R_{pl}N,$$

where $I_{coil}$ is a coil current, $P_{pl}$—is a power deposited in plasma by the coil, $R_{pl}$—is plasma resistance and N—is a number of turns of the coil. Low current allows usage of a regular medium gauge wires in the coil, rather than large gauge wires or copper tubes.

Due to the lower operation frequency (f), the secondary inductive element 440 with inductance L does not need to operate at as high a voltage as a coil operated at a higher frequency of the same diameter D (assuming it deposits into plasma the same power $P_{pl}$ and produces plasma with the same parameters, $R_{pl}$):

$$V_{coil} \propto fLI_{coil} \propto fDN^2 I_{coil} \propto fDN\sqrt{P_{pl}/R_{pl}}$$

and with smaller diameter the voltage is much smaller than that used for driving the first coil. Because the secondary inductive element 440 can be operated at a reduced voltage and current, the secondary inductive element 440 can have a compact design that can be embedded into the Faraday shield portion 454.

According to aspects of the present disclosure, the inductive elements 430 and 440 can carry different functions. Specifically, only the primary inductive element 430 can be tasked to carry out the most vital function of the plasma generation during ignition and providing enough priming for the secondary inductive element 440. This primary inductive element 430 can participate in the operation of the ICP tool and should have coupling to both plasma and the grounded shield to stabilize plasma potential. The Faraday shield portion 454 associated with the primary inductive element 430 avoids window sputtering and can be used to supply the coupling to the ground.

Additional coils can be operated in the presence of good plasma priming provided by the primary inductive element 430 and as such, preferably have good plasma coupling and good energy transfer efficiency to plasma. A secondary inductive element 440 that includes a magnetic flux concentrator 444 provides both a good transfer of magnetic flux to plasma volume and at the same time a good decoupling of the secondary inductive element 440 from the surrounding metal shield portion 452. The use of magnetic flux concentrators 444 and symmetric driving of the secondary inductive element 440 further reduces the amplitude of the voltage between coil ends and surrounding grounded elements. This practically eliminates sputtering of the dome, but at the same time gives some small capacitive coupling to plasma, which can be used to assist ignition.

An ICP source for the plasma processing apparatus 400 has shown very robust behavior of the source and very wide process window. The source can easily ignite and sustain plasma in most process gases (including "difficult" gases like pure HBr or $SF_6$) with significantly lower total power than otherwise was needed if one used only one coil. One could even sustain these discharges without any bias power. In fact, the use of the exemplary inductive element arrangement of the present disclosure actually showed better stability and efficiency than sources with only one kind of coil or with multiple coils of similar structure. Despite numerous attempts, instabilities associated with discharges in electronegative gases, often observed in other ICP reactors have not been detected.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A dual frequency matching circuit, comprising:
a first input port configured to receive RF power at a first frequency;
a second input port configured to receive RF power at a second frequency;
matching circuitry provided in a unitary physical enclosure, the matching circuitry comprising:
a first circuit portion comprising one or more first tuning elements and a first bypass filter, the one or more first tuning elements configured to receive the RF power at the first input port and provide impedance matching for a first load;
a first phase-mag detector coupled between the first input port and the first circuit portion;
a first voltage-current (VI) probe coupled between the first circuit portion and a first output port;
a second circuit portion comprising one or more second tuning elements and a second by pass filter, the one or more second tuning elements configured to receive the RF power at the second input port and provide impedance matching for a second load;
a second phase-mag detector coupled between the second input port and the second circuit portion;
a second VI probe coupled between the second circuit portion and a second output port;
the first output port coupled to the first circuit portion of the matching circuitry and configured to provide a first output signal to the first load at the first frequency; and
the second output port coupled to the second circuit portion of the matching circuitry and configured to provide a second output signal to the second load at the second frequency.

2. The dual frequency matching circuit of claim 1, wherein the first output port and the second output port are spaced apart from one another at a distance.

3. The dual frequency matching circuit of claim 2, wherein the distance is in a range of between about 1 inch to about 35 inches.

4. The dual frequency matching circuit of claim 1, wherein one or more partitions are provided within the unitary physical enclosure and positioned between the first circuit portion and the second circuit portion.

5. The dual frequency matching circuit of claim 1, wherein the first bypass filter is positioned between the first input port and the one or more first tuning element; the first bypass filter element configured to filter out residual power at the second frequency that is leaked to the first circuit portion.

6. The dual frequency matching circuit of claim 1, wherein the second bypass filter is positioned between the second input port and the one or more second tuning element, the second bypass filter element configured to filter out residual power at the first frequency that is leaked to the second circuit portion.

7. The dual frequency matching circuit of claim 1, wherein the one or more first tuning element comprises a first shunt capacitor and a first series capacitor, the first shunt capacitor is positioned in parallel to the first bypass filter and before the first series capacitor, the first series capacitor is positioned between first shunt capacitor and the first output port.

8. The dual frequency matching circuit of claim 1, wherein the one or more first tuning element comprises a first shunt capacitor and a first series capacitor, the first shunt capacitor is positioned in parallel to the first by pass filter and is positioned between the first series capacitor and the first output port, the first series capacitor is positioned between the first bypass filter and the second shunt capacitor.

9. The dual frequency matching circuit of claim 1, wherein the one or more second tuning element comprises a second shunt capacitor and a second series capacitor, the second shunt capacitor is positioned in parallel to the second bypass filter, the second series capacitor is positioned between the second bypass filter and the second shunt capacitor.

10. The dual frequency matching circuit of claim 1, wherein
the first VI probe configured to measure RF voltage and RF current of the first output signal; and
the second VI probe configured to measure RF voltage and RF current of the second output signal.

11. A power generation system for inductively coupled plasma (ICP) loads, comprising:
a first RF generator configured to provide electromagnetic energy at a first frequency in a continuous mode or a pulsed mode;
a second RF generator configured to provide electromagnetic energy at a second frequency in a continuous mode or a pulsed mode, wherein the second frequency is different than the first frequency;
matching circuitry comprising:
a first circuit portion of one or more first tuning elements and a first bypass filter configured to receive the electromagnetic energy at the first frequency and provide impedance matching for a first ICP load;
a first phase-mag detector coupled between the first RF generator and the first circuit portion;
a first voltage-current (VI) probe coupled between the first circuit portion and the first ICP load; and
a second circuit portion of one or more second tuning elements and a second bypass filter configured to receive the electromagnetic energy at the second frequency and provide impedance matching for a second ICP load;
a second phase-mag detector coupled between the second RF generator and the second circuit portion;
a second VI probe coupled between the second circuit portion and the second ICP load;
a unitary physical enclosure housing the first circuit portion and the second circuit portion;
the first ICP load coupled to the first circuit portion of the matching circuitry and configured to provide a first output signal to the first load at the first frequency; and
the second ICP load coupled to the second circuit portion of the matching circuitry and configured to provide a second output signal to the second load at the second frequency.

12. The power generation system of claim 11, wherein the first bypass filter is positioned between the first RF generator and the one or more first tuning element; the first bypass filter element configured to filter out residual power at the second frequency that is leaked to the first circuit portion.

13. The power generation system of claim 11, wherein the second bypass filter is positioned between the second RF generator and the one or more second tuning element, the second bypass filter element configured to filter out residual power at the first frequency that is leaked to the second circuit portion.

14. The power generation system of claim 11, wherein the one or more first tuning element comprises a first shunt capacitor and a first series capacitor, the first shunt capacitor is positioned in parallel to the first bypass filter and before the first series capacitor, the first series capacitor is positioned between first shunt capacitor and the first ICP load.

15. The power generation system of claim 11, wherein the one or more first tuning element comprises a first shunt capacitor and a first series capacitor, the first shunt capacitor is positioned in parallel to the first by pass filter and is positioned between the first series capacitor and the first ICP load, the first series capacitor is positioned between the first bypass filter and the second shunt capacitor.

16. The power generation system of claim 11, wherein the one or more second tuning element comprises a second shunt capacitor and a second series capacitor, the second shunt capacitor is positioned in parallel to the second bypass filter, the second series capacitor is positioned between the second bypass filter and the second shunt capacitor.

17. The power generation system of claim 11, wherein
the first VI probe configured to measure RF voltage and RF current of the first output signal; and
the second VI probe configured to measure RF voltage and RF current of the second output signal.

\* \* \* \* \*